(12) United States Patent
Chang et al.

(10) Patent No.: US 11,837,300 B2
(45) Date of Patent: *Dec. 5, 2023

(54) MULTI-FUSE MEMORY CELL CIRCUIT AND METHOD

(71) Applicant: Taiwan Semiconductor Manufacturing Company Limited, Hsinchu (TW)

(72) Inventors: Meng-Sheng Chang, Hsinchu (TW); Chia-En Huang, Hsinchu (TW); Shao-Yu Chou, Hsinchu (TW); Yih Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/855,876

(22) Filed: Jul. 1, 2022

(65) Prior Publication Data

US 2022/0336030 A1 Oct. 20, 2022

Related U.S. Application Data

(63) Continuation of application No. 17/378,923, filed on Jul. 19, 2021, now Pat. No. 11,410,740, which is a continuation of application No. 16/870,007, filed on May 8, 2020, now Pat. No. 11,094,387.

(60) Provisional application No. 62/867,323, filed on Jun. 27, 2019.

(51) Int. Cl.
  *G11C 17/00* (2006.01)
  *G11C 17/16* (2006.01)
  *G11C 17/18* (2006.01)
  *H01L 23/525* (2006.01)
  *H01L 23/528* (2006.01)
  *H10B 20/20* (2023.01)

(52) U.S. Cl.
  CPC .............. *G11C 17/16* (2013.01); *G11C 17/18* (2013.01); *H01L 23/528* (2013.01); *H01L 23/5256* (2013.01); *H10B 20/20* (2023.02)

(58) Field of Classification Search
  CPC ........ G11C 17/16; G11C 17/18; H10B 20/20; H01L 23/5256; H01L 23/528
  USPC .......................................................... 365/96
  See application file for complete search history.

(56) References Cited

U.S. PATENT DOCUMENTS

| | | |
|---|---|---|
| 6,690,597 B1 | 2/2004 | Perlov et al. |
| 7,432,755 B1 | 10/2008 | Park et al. |
| 7,715,219 B2 | 5/2010 | Monreal |
| 7,973,590 B2 | 7/2011 | Shin et al. |
| 8,699,256 B2 | 4/2014 | Kubouchi et al. |
| 9,287,009 B2 | 3/2016 | Kang et al. |
| 10,032,521 B2 | 7/2018 | Grigoriev et al. |

(Continued)

*Primary Examiner* — Viet Q Nguyen
(74) *Attorney, Agent, or Firm* — Jones Day

(57) ABSTRACT

A multi-fuse memory cell is disclosed. The circuit includes: a first fuse element electrically coupled to a first transistor, a gate of the first transistor is electrically coupled to a first selection signal; a second fuse element electrically coupled to a second transistor, a gate of the second transistor is electrically coupled to a second selection signal, both the first transistor and the second transistor are grounded; and a programming transistor electrically coupled to the first fuse element and the second fuse element, wherein a gate of the programming transistor is electrically coupled to a programming signal.

20 Claims, 10 Drawing Sheets

(56) References Cited

U.S. PATENT DOCUMENTS

| | | | |
|---|---|---|---|
| 10,269,704 B2 * | 4/2019 | Yu | H01L 27/0207 |
| 10,916,317 B2 | 2/2021 | Chung | |
| 11,094,387 B2 * | 8/2021 | Chang | H01L 23/5256 |
| 11,410,740 B2 * | 8/2022 | Chang | H01L 23/528 |
| 2003/0052712 A1 | 3/2003 | Comer | |
| 2004/0124458 A1 | 7/2004 | Kothandaraman | |
| 2004/0207079 A1 | 10/2004 | Matsumoto | |
| 2006/0158920 A1 | 7/2006 | Sumi et al. | |
| 2008/0101146 A1 | 5/2008 | Paak et al. | |
| 2009/0109724 A1 | 4/2009 | Buer et al. | |
| 2009/0135640 A1 | 5/2009 | Kim et al. | |
| 2013/0182518 A1 | 7/2013 | Kim et al. | |
| 2015/0023088 A1 | 1/2015 | Sforzin | |
| 2015/0049546 A1 | 2/2015 | Choi | |
| 2015/0325316 A1 | 11/2015 | Kang et al. | |
| 2019/0333594 A1 | 10/2019 | Riley et al. | |
| 2019/0392911 A1 | 12/2019 | Jo | |
| 2020/0160927 A1 | 5/2020 | Jung et al. | |

* cited by examiner

MULTI-FUSE MEMORY CELL CIRCUIT AND METHOD

CROSS-REFERENCE TO RELATED APPLICATIONS

This application is a continuation application of U.S. patent application Ser. No. 17/378,923, filed Jul. 19, 2021; which is a continuation application of U.S. patent application Ser. No. 16/870,007, filed May 8, 2020, and granted as U.S. Pat. No. 11,094,387; which claims priority to U.S. Provisional Application No. 62/867,323, filed Jun. 27, 2019, entitled "Double-Fuse Element and Method for Better Read Window," all of which are incorporated herein by reference in their entireties.

BACKGROUND

A memory device includes a memory cell operable so as to store a bit, i.e., "1" or "0", of data therein. The memory cell (e.g., a read only memory (ROM) cell) can include a fuse unit which contains a fuse. In one example, when the fuse is blown or programmed, a bit, e.g., "1" is stored in the memory cell. Otherwise, i.e., when the fuse is left intact or un-programmed, a bit, e.g., "0", is stored in the memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
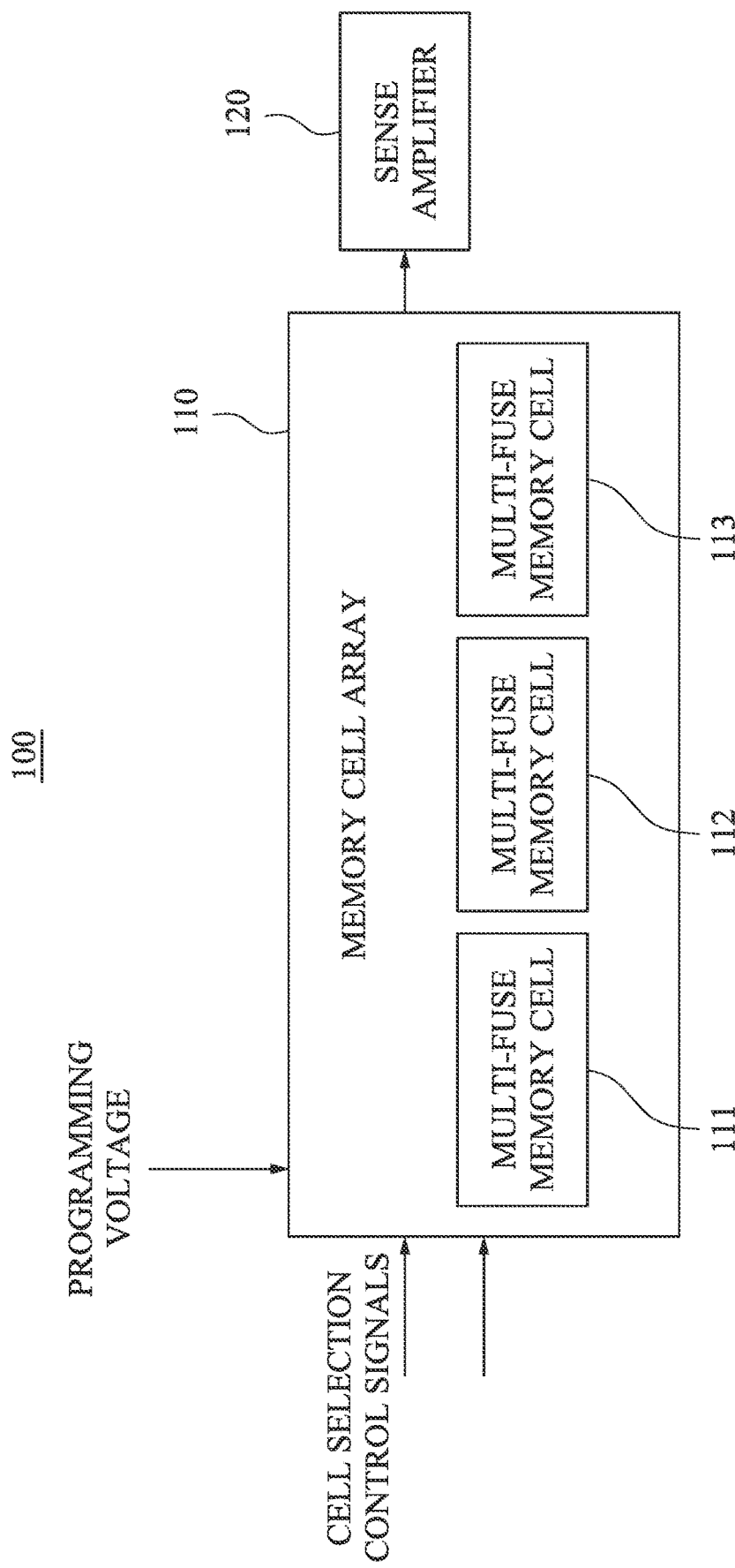
FIG. 1A is a schematic diagram illustrating a memory device having multi-fuse memory cells according to an exemplary embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic diagram illustrating a memory device having multi-fuse memory cells according to an exemplary embodiment. According to some embodiments, a memory device 100 includes a memory cell array 110, which further includes a plurality of multi-fuse memory cells, for example, 111, 112 and 113. Each of the multi-fuse memory cells 111, 112, 113 is configured to store a bit of memory (e.g., a '1' bit or a '0' bit, and each multi-fuse memory cell includes more than one fuses. A programming voltage is fed into the memory cell array to selectively blow fuses (e.g., apply a sufficiently high voltage so as to melt or otherwise damage the fuse to create an open circuit) to program the memory cells. Cell selection control signals are implemented for memory cell array cell selection. The cell selection control signals can be used to select individual multi-fuse memory cells 111, 112, 113, to which a command is targeted, and in embodiments, cell selection signals can be utilized to create conduction paths (as described further herein) through individual memory cells 111, 112, 113 to facilitate data read or write (programming) operations. A sense amplifier 120 is connected to the memory cell array 110. Further details regarding the multi-fuse memory cells will be discussed below.

Figure 1B:
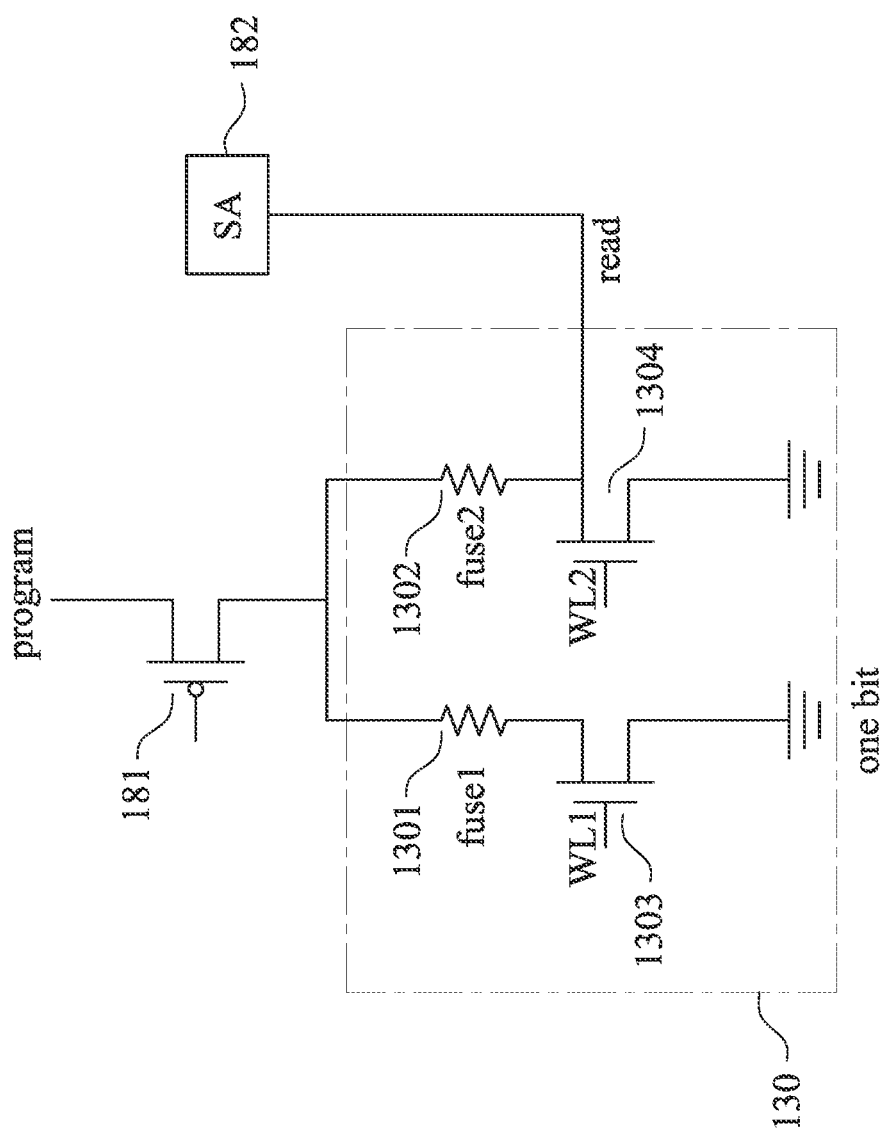
FIG. 1B is a schematic diagram illustrating a memory device with double-fuse according to an exemplary embodiment.

FIG. 1B is a schematic diagram illustrating a memory device with double-fuse according to an exemplary embodiment. According to some embodiments, one or more of the multi-fuse memory cells discussed in FIG. 1A further include a first fuse element 1301 connected to a first transistor 1303 and a second fuse element 1302 connected to a second transistor 1304. The gates of both the first and the second transistors are connected to a first word line WL1 and a second word line WL2, respectively (e.g., cell selection signals that originate from outside the memory cell or within the memory cell). Both transistors 1303 and 1304 are grounded. According to some embodiments, the two fuse elements form one bit. According to some embodiments, a program voltage line is connected to the memory cell representing one bit having two fuse elements through a transistor 181. According to some embodiments, a sense amplifier module (SA) 182 is connected between the second fuse element 1302 and the second transistor 1304. The first and second fuse elements 1301 and 1302 can be both metal fuses, can be both poly fuses, or can be one poly fuse and one metal fuse.

While an individual fuse in a memory cell may be unintentionally blown (e.g., by a static discharge) resulting in a bit meant to be a '0' bit being read as a '1' (e.g., based on an open circuit caused by the unintentionally blown fuse), it is unlikely that multiple fuses in a single cell will accidentally be blown. Under normal operating conditions, when both the first fuse element 1301 and the second fuse element 1302 are blown, the bit cell represents a '1' value. The '1' state of the cell can be discerned by measuring a current through the fuses 1301, 1302 originating from the sense amplifier 182 to transistor 1303, where a minimal current will be observed due to blown fuses 1301, 1302. And when both the first fuse element 1301 and the second fuse element 1302 are intact, the bit cell represents a '0' value. The '0' state of the cell can be discerned by measuring a current through the fuses 1301, 1302 from the sense amplifier 182 to transistor 1303, where a materially larger current will be observed through intact fuses 1301, 1302.

Figure 1C:
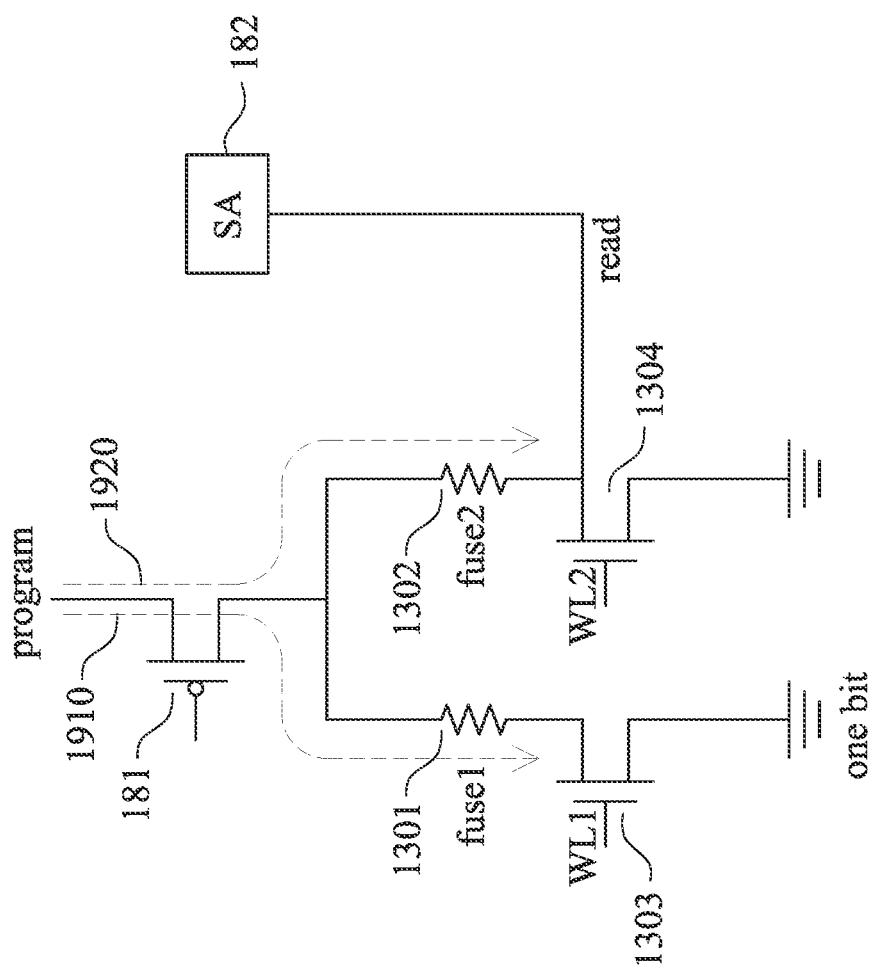
FIG. 1C is a schematic diagram illustrating programming a memory device with double-fuse according to an exemplary embodiment.

FIG. 1C is a schematic diagram illustrating programming a memory device with double-fuse according to an exemplary embodiment. According to some embodiments, in a first operation mode, or programming mode, the multi-fuse memory cell is controlled to program two fuse elements 1301 and 1302, as illustrated by paths 1910 and 1920 passing through fuse elements 1301 and 1302 respectively. Specifically, a programming transistor 181 controls application of a program voltage to the first and second fuse elements 1301, 1302. The program voltage is a sufficiently high voltage to blow the fuse elements 1301 when they are exposed to the program voltage. It is noted that this program voltage is typically substantially higher (e.g., 1.25 times, two times) than the read voltage that is applied by the sense amplifier 182 as described above during a read operation. In a programming mode, the multi-fuse memory circuit is configured to program the first fuse element 1301 and second fuse element individually. Before programming, both the first fuse element 1301 and the second fuse element 1302 are in the intact state.

When the bit cell is to be programmed as a '1' bit value, both of the fuse elements 1301, 1302 are to be blown. To blow the first fuse element 1301, a low voltage is applied to the programming transistor 181, a high voltage is applied at WL1 to the first transistor 1303, and a low voltage is applied at WL2 to the second transistor 1304 to create a conductive path 1910 from the programming voltage to ground through the first fuse element 1301, blowing the first fuse element 1301. Similarly, to blow the second fuse element 1302, a low voltage is applied to the programming transistor 181, a high voltage is applied at WL2 to the second transistor 1304, and a low voltage is applied at WL1 to the first transistor 1303 to create a conductive path 1920 from the programming voltage to ground through the second fuse element 1302, blowing the second fuse element 1302.

In contrast, when the bit cell is to be programmed as a '0' bit value, the first and second fuse elements 1301, 1302 are never exposed to the programming voltage (e.g., by not applying a low voltage at the programming transistor 181 or not applying a high voltage at WL1 or WL2 while the programming transistor 181 is on), such that the first fuse element 1301 and second fuse element remain intact.

Figure 1D:
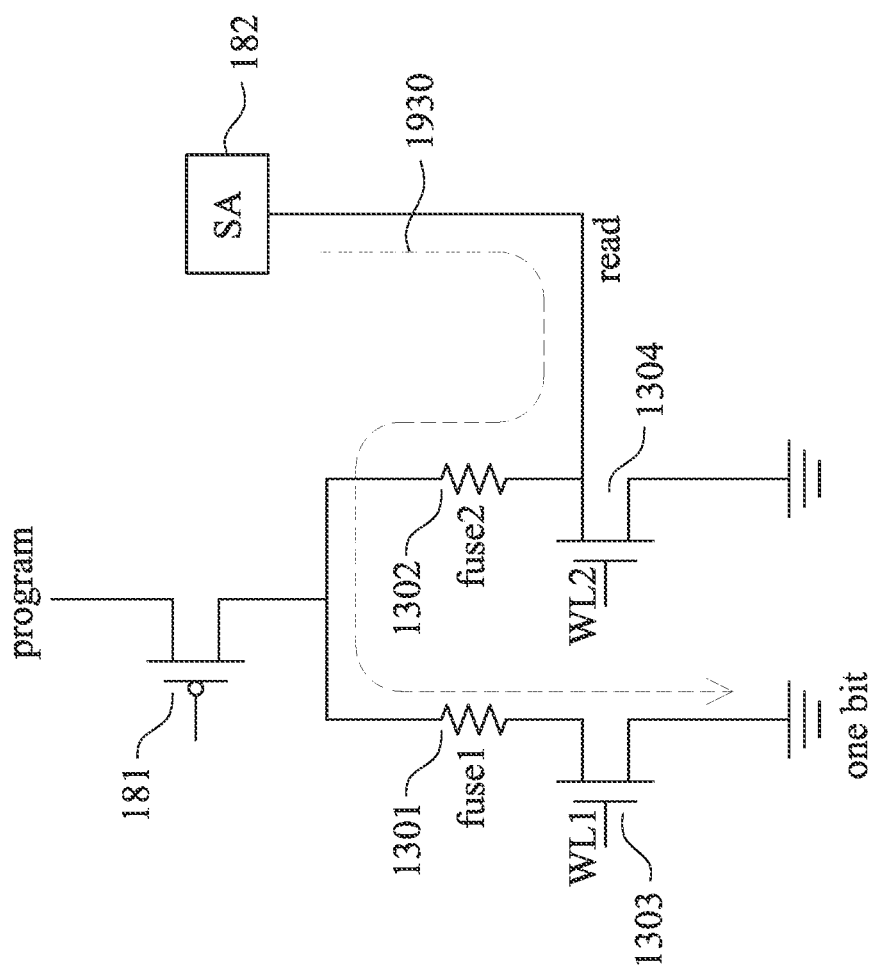
FIG. 1D is a schematic diagram illustrating a read operation of a memory device with double-fuse according to an exemplary embodiment.

FIG. 1D is a schematic diagram illustrating a read operation of a memory device with double-fuse according to an exemplary embodiment. According to some embodiments, in a second operation mode, or read mode, a read path 1930 is followed that starts from the sense amplifier 182, runs through the second fuse element 1302 and the first fuse element 1301 and through first transistor 1303 to ground. Specifically, a low voltage is applied to the second transistor 1304 at WL2 to turn the second transistor 1304 off, and a high voltage is applied to the first transistor 1303 at WL1 to turn the first transistor 1303 on to create the read path 1930. (The program transistor 181 is turned off via a high voltage during this read operation.) The sense amplifier 182 generates a voltage at the start of the read path 1930 and senses the amount of current drawn. If the first fuse element 1301 or the second fuse element 1302 are blown completely, an open circuit will be present on the read path 1930 and zero or little current will flow and be sensed, indicating a '1' bit. If the first fuse element 1301 and the second fuse element 1302 are intact, current will flow and be sensed, indicating a '0' bit. If one or both of the first and second fuse elements 1301, 1302 are partially blown, a lesser amount of current will flow and be detected. If the amount of current detected is more than a threshold amount, then a '1' value is sensed. If the amount of current is less than the threshold amount, a '0' value is sensed, as described further herein. In the read path 1930, the total fuse resistance is $R_{fuse}=R_{fuse1}+R_{fuse2}$ on the read path 1930 because 1301 and 1302 are connected in serial.

Figure 2A:
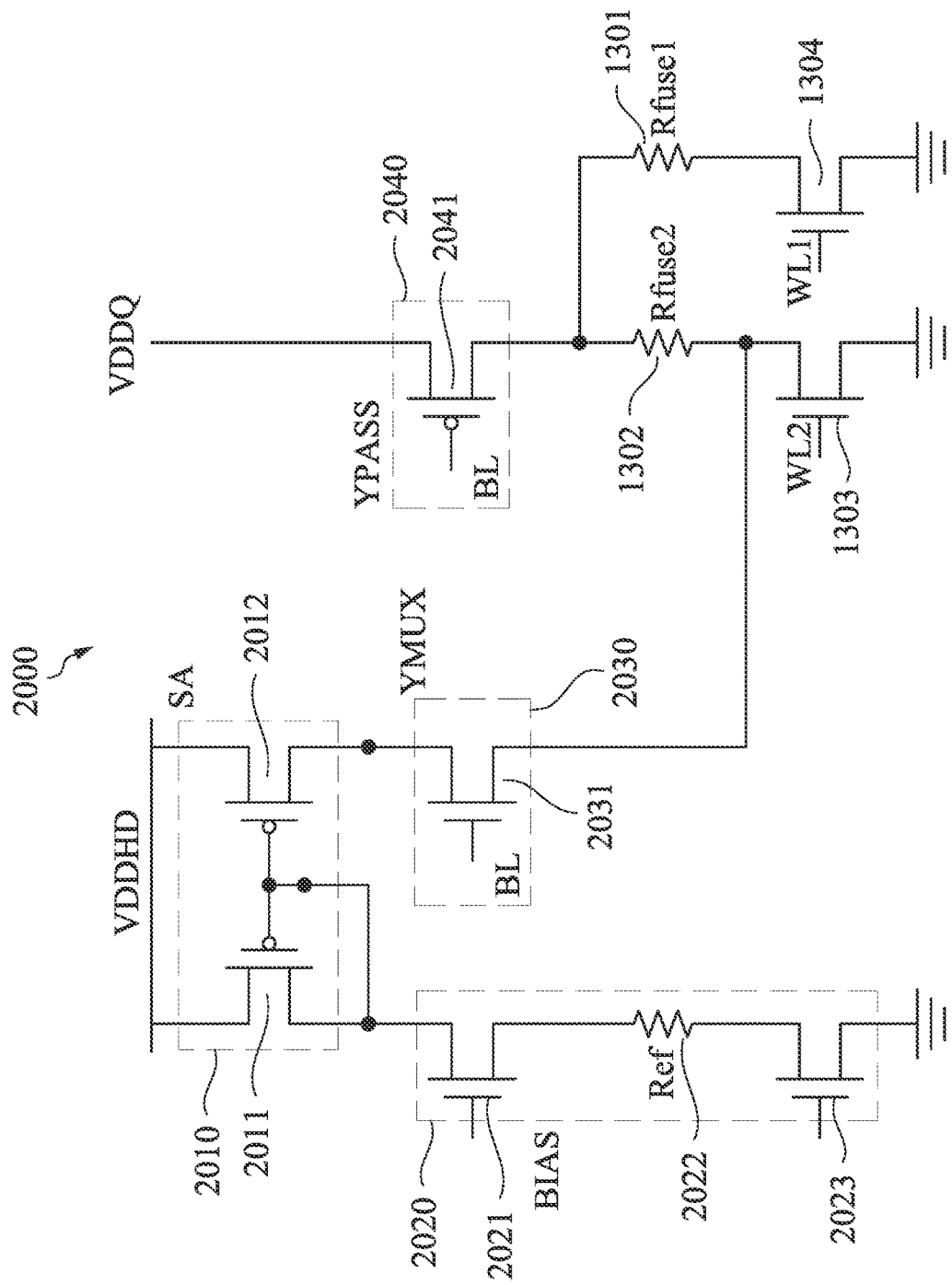
FIG. 2A is a schematic diagram illustrating an operation of a memory device according to an exemplary embodiment.

FIG. 2A is a schematic diagram illustrating an operation of a memory device according to an exemplary embodiment. According to some embodiments, a circuit 2000 includes a sense amplifier (SA) 2010, a bias module (BIAS) 2020, a YMUX module 2030, a YPASS module 2040, and the one bit with two fuse elements 1301 and 1302 connected to transistors 1303 and 1304 respectively, as illustrated in FIG. 1B above. According to some embodiments, the SA module 2010 includes two transistors 2011 and 2012, whose gates are connected together. The two transistors 2011 and 2012 are both connected to VDDHD. According to some embodiments, the BIAS module 2020 includes transistor 2021, reference resistor 2022 and another transistor 2023 connected in serial. The transistor 2023 is grounded. According to some embodiments, the YMUX module 2030 includes a transistor 2031 whose gate is connected to BL. And the transistor 2031 is connected to the second fuse element 1302. According to some embodiments, the YPASS module 2040 includes a transistor 2041 whose gate is connected to BL. The transistor 2041 is connected to the one bit with two fuse elements 1301 and 1302. The transistor 2041 is also connected to the programming voltage VDDQ (e.g., a voltage that is higher than VDDHD).

Figure 2B:
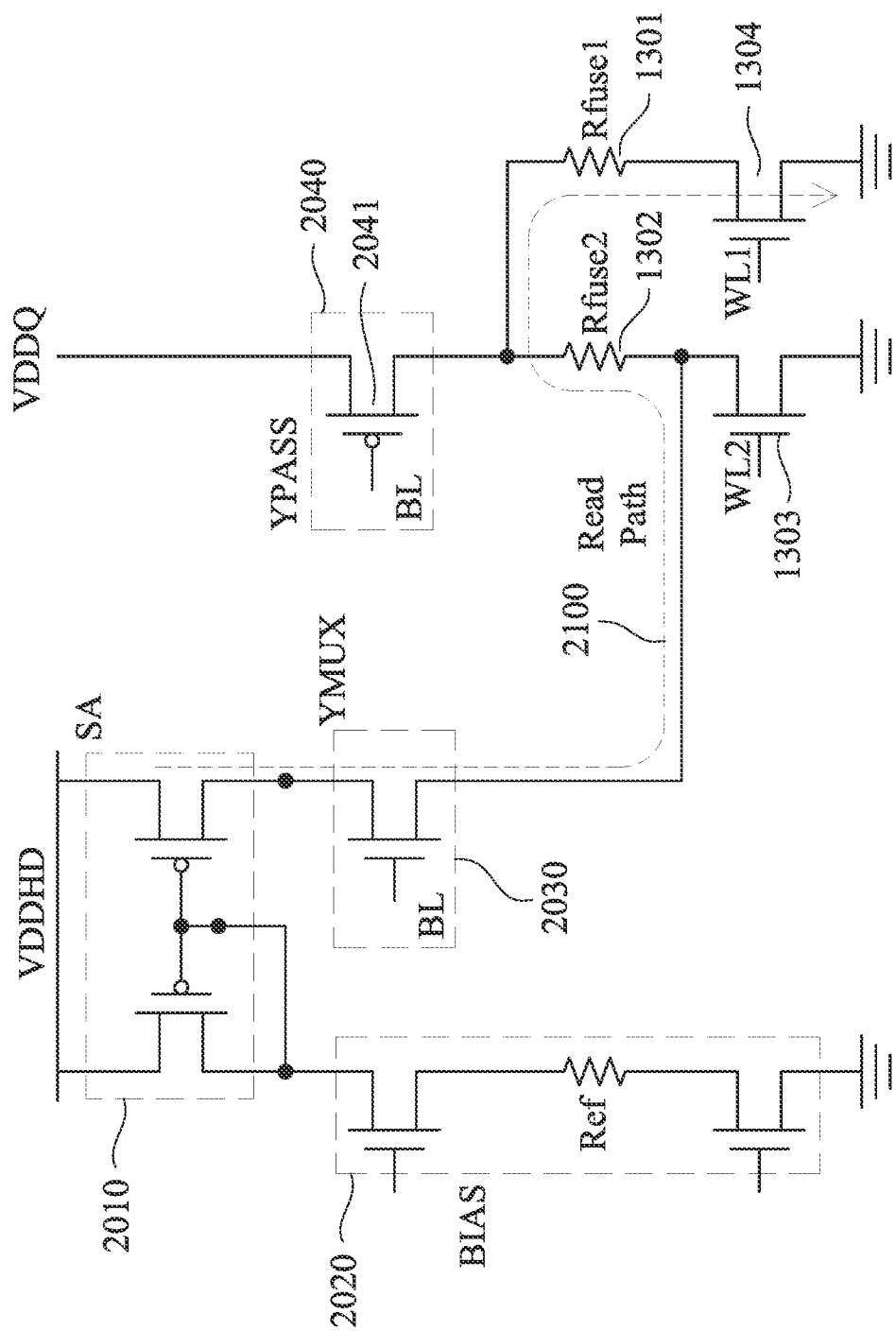
FIG. 2B is a schematic diagram illustrating a read operation of a memory device according to an exemplary embodiment.

FIG. 2B is a schematic diagram illustrating a read operation of a memory device according to an exemplary embodiment. According to some embodiments, the read path 2100 goes from the SA module 2010, then to the YMUX module 2030, then goes through the second fuse element 1302, then the first fuse element 1301. As discussed in FIG. 1D above, the total fuse resistance is $R_{fuse}=R_{fuse1}+R_{fuse2}$ on the read path 2100 because 1301 and 1302 are connected in serial. Specifically, during a read operation, BL is set high, turning on YMUX module 2030 transistor 2031 and turning off the programming transistor 2041 of the YPASS module. A low signal is provided at WL2 to turn transistor 1303 off and a high signal is provided at WL1 to turn transistor 1304 on, providing a read path 2100 from SA 2010 through YMUX 2030, first and second fuses 1301, 1302, and second transistor 1304. The sense amplifier 2010 compares current drawn by the read path to a threshold reference current drawn by BIAS module 2020. If the amount of current by the read path is greater than the threshold reference current (e.g., because the first and second fuses 1301, 1302 are intact or substantially intact) then a '0' value is sensed by the SA 2010. If the amount of current sensed at 2100 is less than the threshold reference current (e.g., because one or both of the first and second fuses 1301, 1302 are blown or substantially blown) then a '1' value is sensed by the SA 2010. According to some embodiments, in the read mode following read path 2100, WL1=H, WL2=L, and BL=H.

Figure 2C:
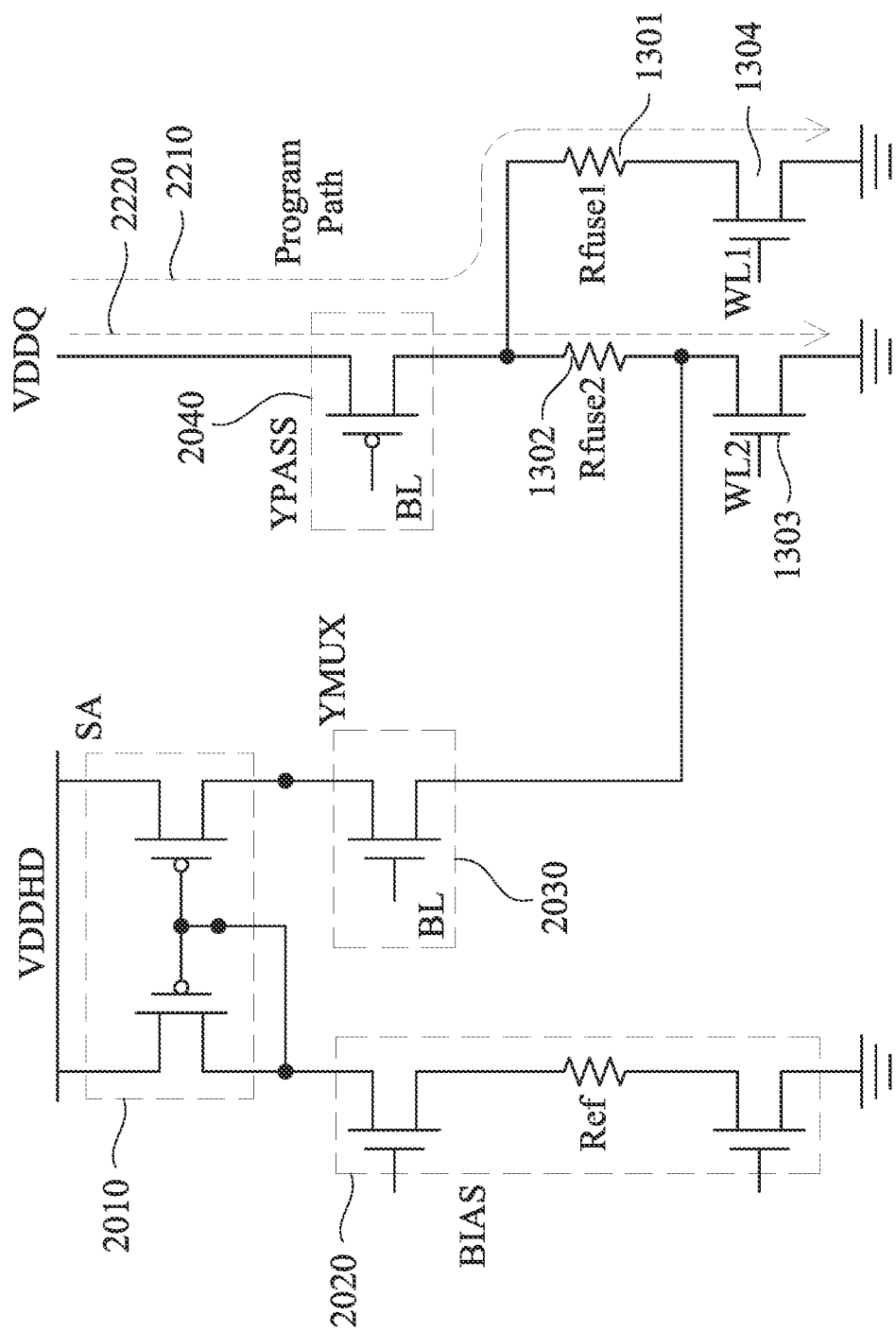
FIG. 2C is a schematic diagram illustrating a write operation of a memory device according to an exemplary embodiment.

FIG. 2C is a schematic diagram illustrating a write operation of a memory device according to an exemplary embodiment. According to some embodiments, a first program path 2210 goes from VDDQ (i.e., a high enough voltage to blow a fuse element when applied to a fuse element) to the YPASS module 2040, then through the first fuse element 1301 and the transistor 1304. According to some embodiments, a second program path 2220 goes from VDDQ to the YPASS module 2040, then through the second fuse element 1302 and the transistor 1303.

According to some embodiments, in the first step of a two-step programming mode (PGM1) to program a '1' bit by blowing the two fuse elements 1301, 1302, the programming voltage VDDQ is applied to the first fuse element 1301, following program path 2210, WL1=H (high), WL2=L (low), and BL=L; in a second step (PGM2), the programming voltage VDDQ is applied to the second fuse element 1302 following program path 2220, WL1=L, WL2=H, and BL=L. According to some embodiments, when the bit cell is a '0' bit, $R_{fuse}=2*R_{virgin\ bit}$; when the bit cell is a '1' bit, $R_{fuse}=2*R_{PGM\ bit}$.

Figure 3:
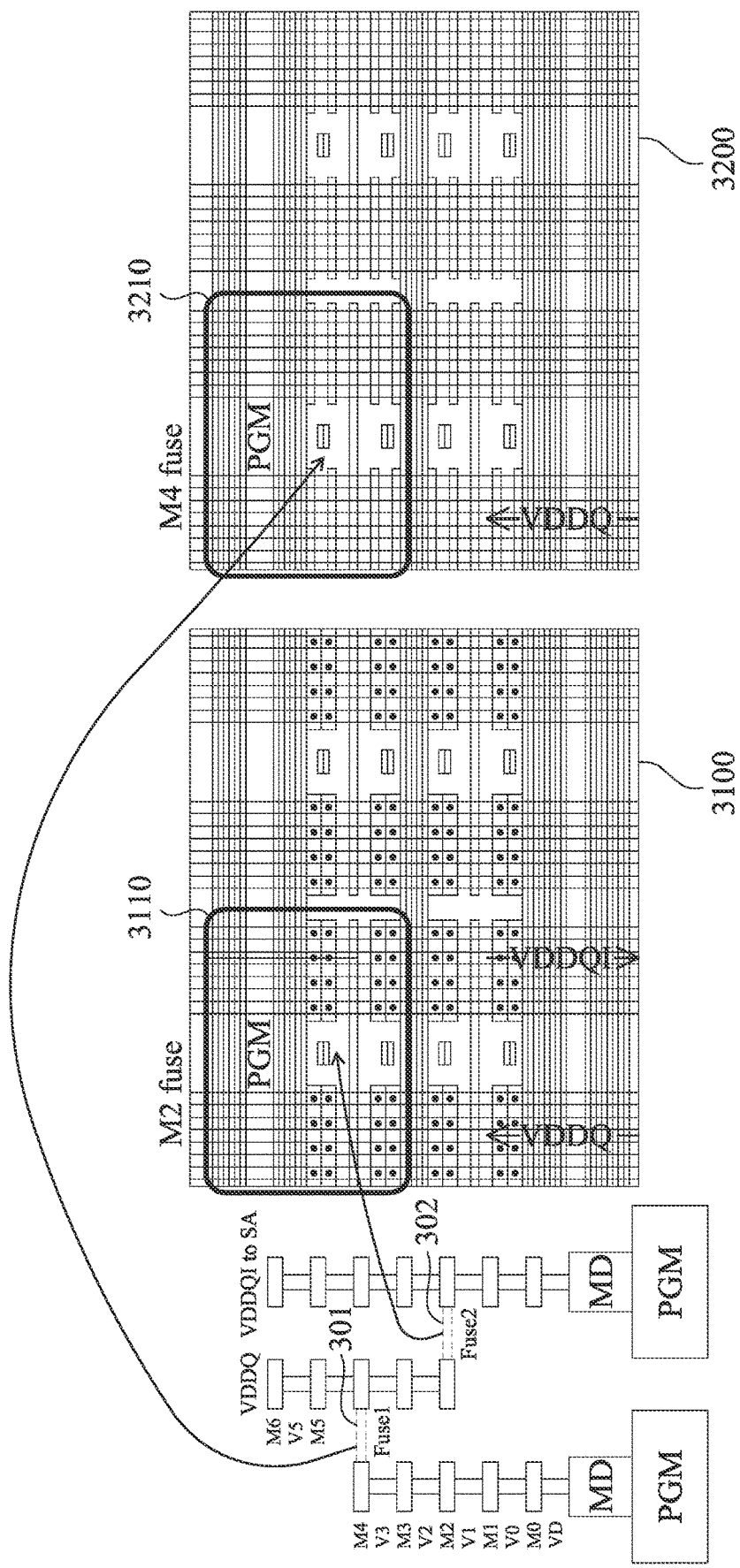
FIG. 3 is a diagram illustrating an example layout implementation of a double fuse circuit according to the exemplary embodiment.

FIG. 3 is a diagram illustrating the layout implementation of a double fuse circuit according to the exemplary embodiment. According to some embodiments, the first fuse element and the second fuse element are implemented in the M4 and M2 layers respectively. As illustrated in FIG. 3, M0, M1, . . . M6 layers are metal layers. VD, V0, V1, . . . V5 layers are sandwiched within. M6 is connected to VDDQ and VDDQI respectively. According to some embodiments, the first fuse element Fuse1 301 is implemented in the M4 layer, and the second fuse element Fuse2 302 is implemented in the M2 layer, as illustrated in the cross sectional view on the left. 3100 and 3200 are top view of the layout corresponding to the left cross sectional view. According to some embodiments, 3110 and 3210 are PGM's, and the first and the second fuse elements 301 and 302 are marked correspondingly.

Figure 4:
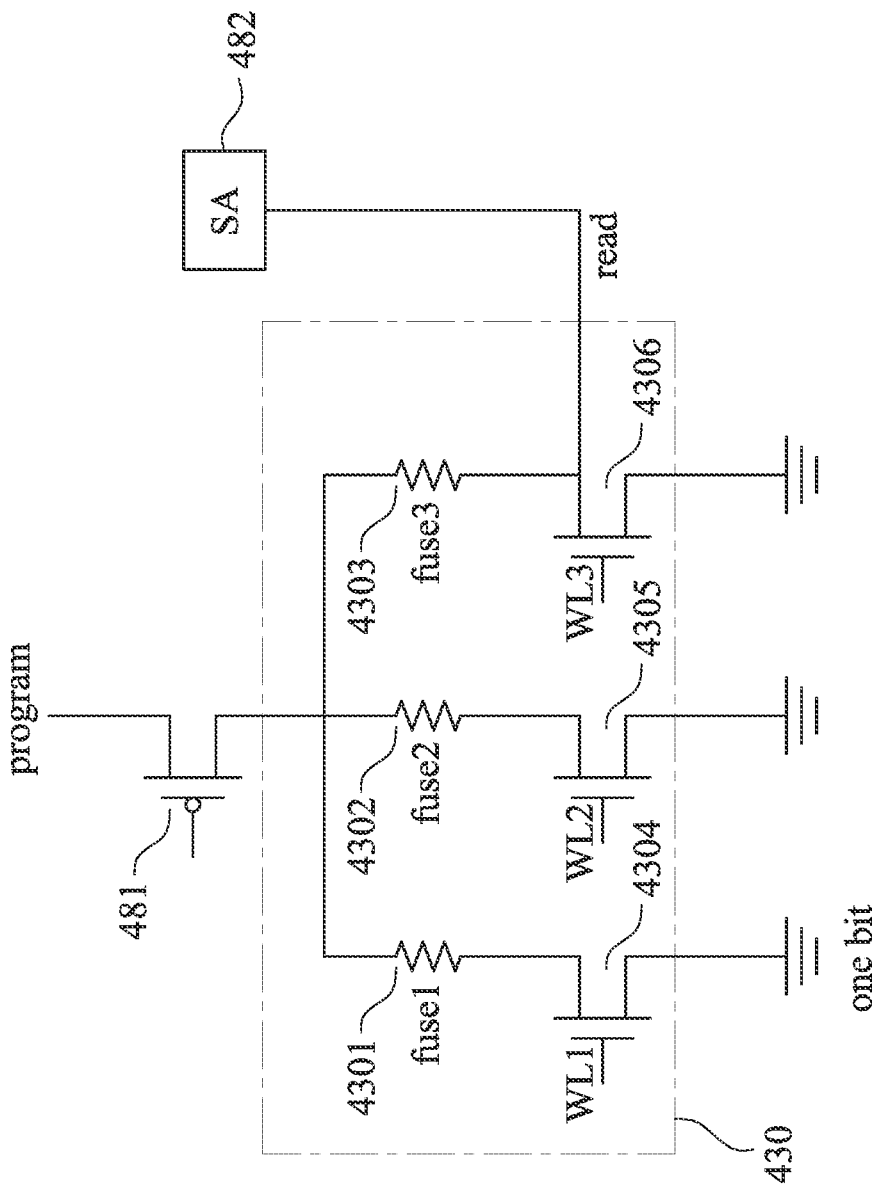
FIG. 4 is a schematic diagram illustrating a memory device with triple-fuse according to an exemplary embodiment.

While the previous examples have illustrated multi-fuse memory cells that utilize two fuses that are programmed individually and then read in parallel, other numbers of fuses may be utilized in a memory cell. FIG. 4 is a schematic diagram illustrating a memory device with triple-fuse according to an exemplary embodiment, where other examples may include even more fuses ($N_{fuses}>=2$). According to some embodiments, a memory device with triple-fuse is similar to the memory device with double-fuse illustrated in FIG. 1B discussed above. The difference is that the multi-fuse memory cell 430 includes three fuse elements 4301, 4302 and 4303, with corresponding word line transistors 4304, 4305 and 4306, respectively. According to some embodiments, all three word line transistors 4304, 4305 and 4306 are grounded. During programming of a '1' value each of the fuse elements 4301, 4302, and 4303 are blown. Specifically, the programming transistor 481 is turned on via a low voltage allowing the programming voltage to reach the top node of the fuse elements 4301, 4302, 4303. Each of WL1, WL2, and WL3 are individually provided high signals to expose each of the respective fuse elements 4301, 4302, 4303 to the programming voltage to blow the fuse. During a read operation, the programming transistor 481 is turned off. Low values are applied to WL2, WL3 to turn those associated transistors off, and a high voltage is applied at WL1 to turn transistor 4304 on. This creates a read path from SA 482, through the three fuse elements 4301, 4302, 4303, and through transistor 4304 to ground. The sense amplifier 482 applies a voltage to the read path and senses an amount of current drawn. If the amount of current drawn is less than a threshold, then a '1' bit is sensed. If the amount of current drawn is more than a threshold amount, then a '0' is sensed.

Figure 5:
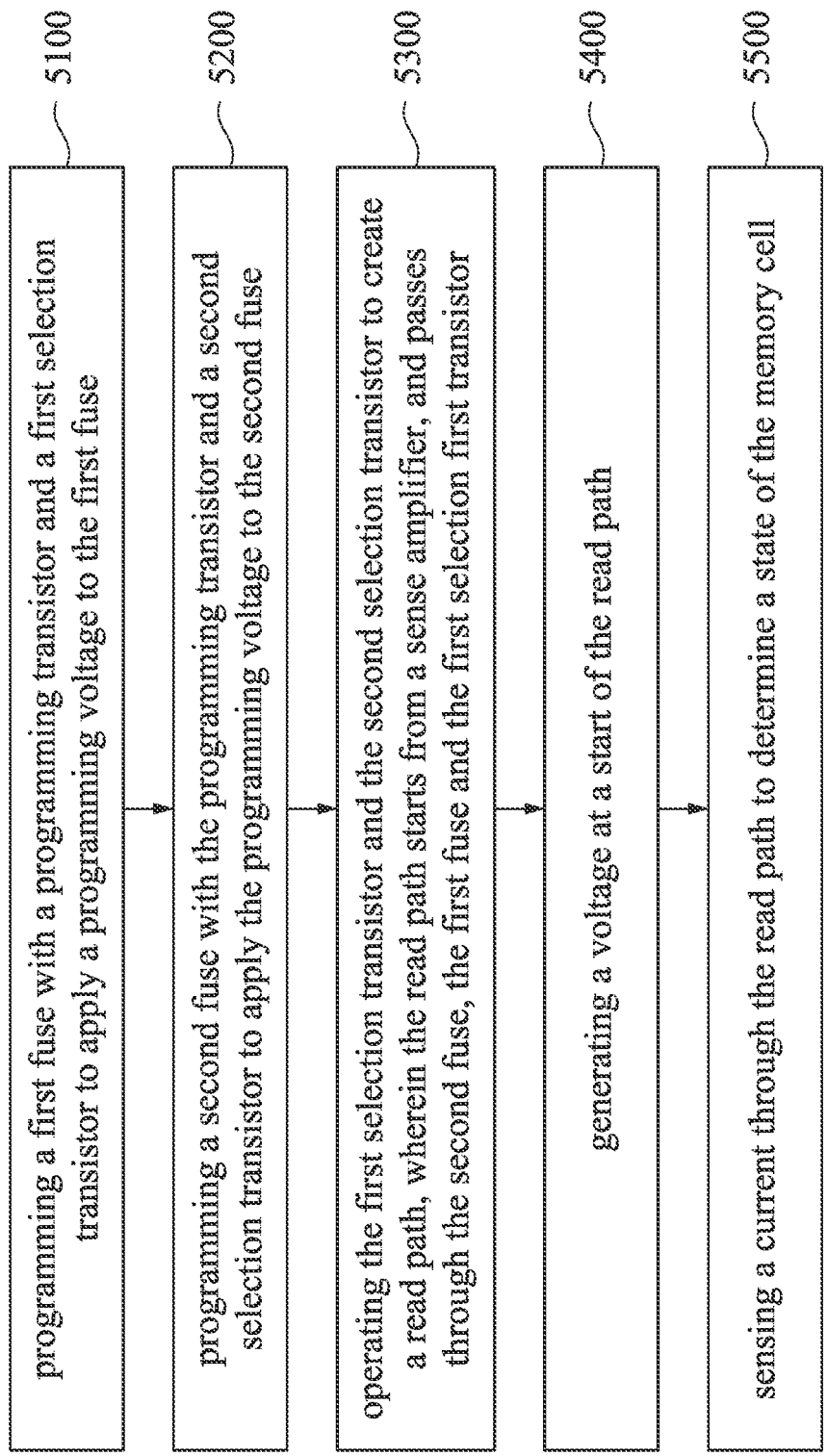
FIG. 5 is a flow chart illustrating a method of operating a double-fuse memory cell according to an exemplary embodiment.

FIG. 5 is a flow chart illustrating a method of operating a multi-fuse memory cell according to an exemplary embodiment. While FIG. 5 is described with reference to structures described above, it is understood that the method applies to many other structures as well. According to some embodiments, a method operating a multi-fuse memory cell includes the steps of S100, S200, S300, S400 and S500. The first step of method of operating a multi-fuse memory cell is S100, programming a first fuse with a programming transistor and a first selection transistor to apply a programming voltage to the first fuse. The second step S200 is programming a second fuse with the programming transistor and a second selection transistor to apply the programming voltage to the second fuse. The third step S300 is operating the first selection transistor and the second selection transistor to create a read path, the read path starts from a sense amplifier, and passes through the second fuse, the first fuse and the first selection first transistor. The fourth step S400 is generating a voltage at a start of the read path. And the fifth step is S500: sensing a current through the read path to determine a state of the memory cell.

According to some embodiments, a multi-fuse cell is disclosed. The circuit includes: a first fuse element electrically coupled to a first transistor, wherein a gate of the first transistor is electrically coupled to a first selection signal; a second fuse element electrically coupled to a second transistor, a gate of the second transistor is electrically coupled to a second selection signal, both the first transistor and the second transistor are coupled to ground voltage; and a programming transistor electrically coupled to the first fuse element and the second fuse element, a gate of the programming transistor is electrically coupled to a programming signal. According to some embodiments, a read path passes through the first fuse, the second fuse and the first transistor. According to some embodiments, a first program path passes through the programming transistor, the first fuse and the first transistor. According to some embodiments, a second program path passes through the programming transistor, the second fuse and the second transistor. According to some embodiments, the first fuse element and the second fuse elements are metal fuses or poly fuses. According to some embodiments, the first fuse element and the second fuse element are implemented in the same metal layer. According to some embodiments, the first fuse element and the second fuse element are implemented in different metal layers. According to some embodiments, the first fuse element is implemented in M4 layer, and the second fuse element is implemented in M2 layer. According to some embodiments, the circuit further includes: a third fuse element electrically coupled to a third transistor, a gate of the third transistor is electrically coupled to a third selection signal. According to some embodiments, the third transistor is coupled to ground voltage. According to some embodiments, the programming transistor is electrically coupled to the third fuse element. According to some embodiments, the circuit further includes: a plurality of fuse elements electrically coupled to the plurality of transistors respectively, wherein gates of the plurality of transistors are electrically coupled to the plurality of selection signals respectively.

According to some embodiments, a method of operating a multi-fuse memory cell is disclosed. The method includes: programming a first fuse with a programming transistor and a first selection transistor to apply a programming voltage to the first fuse; programming a second fuse with the programming transistor and a second selection transistor to apply the programming voltage to the second fuse; operating the first selection transistor and the second selection transistor to create a read path, wherein the read path starts from a sense amplifier, and passes through the second fuse, the first fuse and the first selection first transistor; generating a voltage at a start of the read path; and sensing a current through the read path to determine a state of the memory cell. According to some embodiments, the programming voltage is a high voltage sufficient to blow fuses when fuses are exposed to the programming voltage. According to some embodiments, the first fuse and the second fuse are programmed sequentially. According to some embodiments, programming the first fuse includes: applying a low voltage to the programming transistor; applying a high voltage to the first selection transistor; and applying a low voltage to the second selection transistor. According to some embodiments, programming the second fuse includes: applying a low voltage to the programming transistor; applying a low voltage to the first selection transistor; and applying a low voltage to the second selection transistor.

According to some embodiments, a memory circuit is disclosed. The circuit includes: a first fuse element; a second fuse element; and a plurality of switches, the plurality of switches configured to: program the first and the second fuse elements individually via individual programming signal paths; and connect the first fuse element and the second fuse element in series to form a read path. According to some embodiments, the circuit further includes: a sense amplifier, wherein the sense amplifier applies a voltage to the read path and compares a sensed current to a reference current. According to some embodiments, the plurality of transistors are grounded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A multi-fuse memory cell circuit, the circuit comprising:
    a first fuse element electrically coupled to a first transistor;
    a second fuse element electrically coupled to a second transistor; and
    a programming transistor electrically coupled to the first fuse element and the second fuse element, wherein a gate of the programming transistor is electrically coupled to a programming signal;
    wherein the second fuse element is configured to be blown upon application of a low voltage to the programming transistor, application of a low voltage to the first transistor, and application of a low voltage to the second transistor.

2. The circuit of claim 1, wherein a read path passes through the first fuse element, the second fuse element and the first transistor.

3. The circuit of claim 1, wherein a first program path passes through the programming transistor, the first fuse element and the first transistor.

4. The circuit of claim 1, wherein a second program path passes through the programming transistor, the second fuse element and the second transistor.

5. The circuit of claim 1, wherein the first fuse element and the second fuse elements are metal fuses or poly fuses.

6. The circuit of claim 1, wherein the first fuse element and the second fuse element are implemented in the same metal layer.

7. The circuit of claim 1, wherein the first fuse element and the second fuse element are implemented in different metal layers.

8. The circuit of claim 1, wherein the first fuse element is implemented in M4 wiring layer, and the second fuse element is implemented in M2 wiring layer.

9. The circuit of claim 1, further comprising:
    a third fuse element electrically coupled to a third transistor, wherein a gate of the third transistor is electrically coupled to a selection signal.

10. The circuit of claim 9, wherein the third transistor is coupled to ground voltage.

11. The circuit of claim 10, wherein the programming transistor is electrically coupled to the third fuse element.

12. The circuit of claim 1, further comprising:
    a plurality of fuse elements electrically coupled to a plurality of transistors respectively, wherein gates of the plurality of transistors are electrically coupled to a plurality of selection signals respectively.

13. A method of operating a multi-fuse memory cell, the method comprising:
    programming a first fuse with a programming transistor and a first selection transistor to apply a programming voltage to the first fuse;
    programming a second fuse with the programming transistor and a second selection transistor to apply the programming voltage to the second fuse;
    operating the first selection transistor and the second selection transistor to create a read path; and
    sensing a current through the read path to determine a state of the memory cell;
    wherein programming the second fuse comprises applying a low voltage to the programming transistor, applying a low voltage to the first selection transistor, and applying a low voltage to the second selection transistor.

14. The method of claim 13, wherein the programming voltage is a high voltage sufficient to blow fuses when fuses are exposed to the programming voltage.

15. The method of claim 13, wherein programming the first fuse comprises:
    applying a low voltage to the programming transistor;
    applying a high voltage to the first selection transistor; and
    applying a low voltage to the second selection transistor.

16. The method of claim 13, wherein the first fuse and the second fuse are metal fuses or poly fuses.

17. A memory circuit, the circuit comprising:
    a first fuse element electrically coupled to a first transistor;

a second fuse element electrically coupled to a second transistor; and a programming transistor electrically coupled to the first fuse element and the second fuse element; wherein the first, second, and programming transistors are configured to program the first and the second fuse elements;

wherein the first fuse element is configured to be blown upon application of a low voltage to the programming transistor, application of a high voltage to the first transistor, and application of a low voltage to the second transistor.

18. The circuit of claim 17, further comprising a sense amplifier.

19. The circuit of claim 18, wherein the first, second, and programming transistors are configured to connect the first fuse element and the second fuse element in series to form a read path; and wherein the sense amplifier applies a voltage to the read path and compares a sensed current to a reference current.

20. The circuit of claim 17, wherein the first and second transistors are grounded.

\* \* \* \* \*